(12) United States Patent
Koh et al.

(10) Patent No.: US 9,564,325 B2
(45) Date of Patent: Feb. 7, 2017

(54) METHODS OF FABRICATING A SEMICONDUCTOR DEVICE

(71) Applicants: Chawon Koh, Yongin-si (KR); Cheol Hong Park, Seoul (KR); Ki-Jeong Kim, Hwaseong-si (KR); Hyunwoo Kim, Seongnam-si (KR); Hyosung Lee, Suwon-si (KR)

(72) Inventors: Chawon Koh, Yongin-si (KR); Cheol Hong Park, Seoul (KR); Ki-Jeong Kim, Hwaseong-si (KR); Hyunwoo Kim, Seongnam-si (KR); Hyosung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 14/328,283

(22) Filed: Jul. 10, 2014

(65) Prior Publication Data

US 2015/0104945 A1   Apr. 16, 2015

(30) Foreign Application Priority Data

Oct. 14, 2013 (KR) .................. 10-2013-0122112

(51) Int. Cl.

| H01L 21/311 | (2006.01) |
|---|---|
| H01L 21/027 | (2006.01) |
| H01L 21/308 | (2006.01) |
| H01L 27/115 | (2006.01) |

(52) U.S. Cl.
CPC ....... *H01L 21/0271* (2013.01); *H01L 21/3086* (2013.01); *H01L 27/11548* (2013.01); *H01L 27/11556* (2013.01); *H01L 27/11575* (2013.01); *H01L 27/11582* (2013.01)

(58) Field of Classification Search
CPC .................. H01L 21/3083; H01L 21/2071
USPC ................................. 430/316, 317
See application file for complete search history.

(56) References Cited

U.S. PATENT DOCUMENTS

| 7,655,386 B2* | 2/2010 | Hyung .................. G03F 7/091 |
|---|---|---|
| | | 430/271.1 |
| 8,008,732 B2 | 8/2011 | Kiyotoshi et al. |
| 8,013,389 B2 | 9/2011 | Oh et al. |
| 8,222,122 B2 | 7/2012 | Shin et al. |
| 8,295,089 B2 | 10/2012 | Jeong et al. |
| 8,338,882 B2 | 12/2012 | Tanaka et al. |
| 8,345,479 B2 | 1/2013 | Maejima |
| 8,383,512 B2 | 2/2013 | Chen et al. |
| 8,411,477 B2 | 4/2013 | Tang et al. |
| 8,426,301 B2 | 4/2013 | Oh et al. |
| 2006/0115772 A1* | 6/2006 | Hah .................. C08G 61/02 |
| | | 430/311 |

(Continued)

FOREIGN PATENT DOCUMENTS

| KR | 1020110015338 A | 2/2011 |
|---|---|---|
| KR | 1020130007200 A | 1/2013 |
| KR | 1020130026912 A | 3/2013 |

*Primary Examiner* — Daborah Chacko Davis
(74) *Attorney, Agent, or Firm* — Myers Bigel, P.A.

(57) ABSTRACT

A method for fabricating a semiconductor device is provided. In the method, a first hard mask layer is formed on a stepped structure. The first hard mask layer has a level top surface and thickness sufficient to etch the structure. A second hard mask pattern is formed on the first hard mask layer. The first hard mask layer is etched using the second hard mask pattern. Size dispersion of the patterns may be reduced by the first hard mask layer.

16 Claims, 19 Drawing Sheets

(56) References Cited

U.S. PATENT DOCUMENTS

| | | |
|---|---|---|
| 2010/0052042 A1 | 3/2010 | Tanaka et al. |
| 2011/0286275 A1 | 11/2011 | Jeon et al. |
| 2012/0119287 A1 | 5/2012 | Park et al. |
| 2012/0206979 A1 | 8/2012 | Shin et al. |
| 2013/0043509 A1 | 2/2013 | Cho et al. |
| 2013/0095653 A1 | 4/2013 | Jin et al. |
| 2013/0189533 A1* | 7/2013 | Okuyama ............... G03F 7/091 428/524 |

* cited by examiner

METHODS OF FABRICATING A SEMICONDUCTOR DEVICE

CROSS-REFERENCE TO RELATED APPLICATIONS

This U.S. non-provisional patent application claims priority under 35 USC §119 to Korean Patent Application No. 10-2013-0122112, filed on Oct. 14, 2013, the entirety of which is hereby incorporated by reference.

BACKGROUND

The inventive concepts described herein generally relate to methods for fabricating semiconductor devices.

In order to meet superior performance and low cost that users desire, there has been a demand for increasing integration density of semiconductor devices. In the case of a semiconductor memory device, its integration density is a main factor for deciding the prices of products, and thus, a demand for higher integration density has increased. In the case of a conventional two-dimensional or planar semiconductor memory device, its integration density is mainly decided by the area that a unit memory cell occupies, and thus, its integration density is significantly affected by the level of technique for forming fine patterns. However, since ultra high-cost equipment is needed for fine patterns, the integration density of the two-dimensional semiconductor memory device is increasing but remains relatively expensive and/or restrictive.

In recent years, three-dimensional semiconductor memory devices, including three-dimensionally arranged memory cells, have been proposed to overcome the above limitations. However, for mass production of three-dimensional semiconductor memory devices, there has been a need for process technology that is capable of reducing manufacturing cost per bit of a three-dimensional semiconductor memory device more than that of a two-dimensional semiconductor memory device and/or implementing reliable product characteristics.

SUMMARY

Embodiments of the inventive concept provide a method for fabricating a semiconductor device. In some embodiments, the method may include preparing a lower structure including a first stack including sequentially stacked first etch target layers and a second stack being disposed on the first stack and including second etch target layers having widths narrower than those of the first etch target layers; forming a first hard mask layer to cover the lower structure, the first hard mask layer having a level top surface; forming a second hard mask pattern on the first hard mask layer, the second hard mask pattern having a width wider than that of the second stack but narrower than that of the first stack; patterning the first hard mask layer using the second hard mask pattern as an etch mask to form a first hard mask pattern and exposing a top surface of the first stack; removing the second hard mask pattern and removing an uppermost first etch target layer of the exposed first stack; reducing a size of the first hard mask pattern; and etching the first stack using the first hard mask pattern as an etch mask.

In some embodiments, reducing the size of the first hard mask pattern and etching the first stack using the first hard mask pattern as an etch mask may be repeated until a lowermost first etch target layer of the first stack is etched.

In some embodiments, the first etch target layers may include a first sacrificial layer and a first inter-gate dielectric which are sequentially stacked, and the second hard mask pattern may contain materials included in the first sacrificial layer and the first inter-gate dielectric.

In some embodiments, forming a first hard mask layer may include coating a composition for the first hard mask layer on the lower structure; and curing the composition.

In some embodiments, an ultrasonic wave may be applied to the composition in at least one step of coating a composition for the first hard mask layer on the lower structure and curing the composition.

In some embodiments, the composition may include at least one of the polymers of Formula (1) and Formula (2) below:

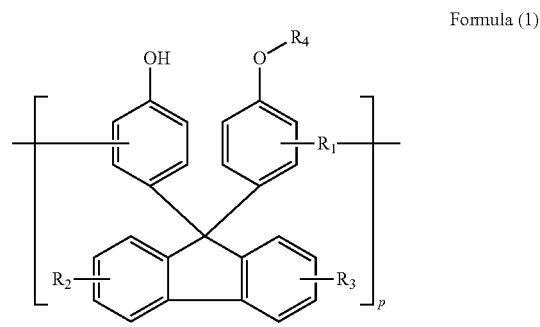

Formula (1)

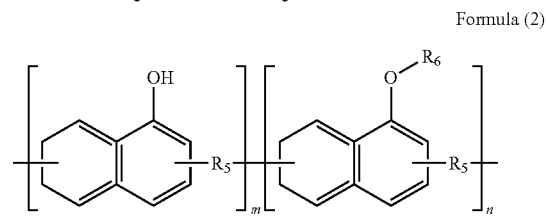

Formula (2)

wherein in the Formula (1), p is an integer ranging from 100 to 3000, $R_1$ is a methylene or an arylene; $R_2$ and $R_3$ are each independently a hydroxyl group, halogen or a hydrocarbon having 0~19 carbons; and $R_4$ is $C_1$-$C_{19}$ alkyl group or an aromatic cyclic compound, and in Formula (2), n+m is an integer ranging from 100 to 3000; $R_5$ is a methylene or an arylene; and $R_6$ is $C_1$-$C_{19}$ alkyl group or an aromatic cyclic compound.

In some embodiments, the composition may further include a surfactant. The surfactant may be a cationic, anionic or non-ionic surfactant.

The anionic surfactant may include a sulfonic acid-based surfactant, a carboxyl acid-based surfactant, and a phosphate-based surfactant. The non-ionic surfactant may include an ethylene oxide (EO) unit (—$CH_2CH_2O$—).

In some embodiments, the surfactant may be at least one of DBS (dodecylbenzene sulfonic acid)[$C_{12}H_{25}C_6H_4SO_3H$], polyoxyethylene(23) lauryl ether)[$C_{12}H_{25}(OCH_2CH_2)_{23}$ OH], polyethylene glycol sorbitan monolaurate, polyoxyethylene isooctylphenyl ether [$CH_3(CH_2)_x(OCH_2CH_2)_y$ $OCH_2COOH$, where x is 11 to 13, and y is 3 to 10], and $CF_3(CF_2CF_2)_n(CH_2CH_2O)_yH$, where n is 2 to 4 and y is 3 to 10.

In some embodiments, the surfactant may be added in an amount ranging from 0.01 ppm to 1000 ppm with respect to the total weight of the composition.

In some embodiments, forming a second hard mask pattern may include forming a second hard mask layer on the first hard mask layer; forming a photoresist pattern on the second hard mask layer; and patterning the second hard mask layer using the photoresist pattern as an etch mask.

In some embodiments, forming a first hard mask layer may include forming a first sub-hard mask layer to cover an entire surface of the lower structure, the first sub-hard mask layer having a level top surface; and forming a second sub-hard mask layer on the first sub-hard mask layer.

In some embodiments, forming a first sub-hard mask layer may include coating a first composition; and curing the first composition. Forming a second sub-hard mask layer may include coating a second composition; and curing the second composition.

In some embodiments, the first composition may include a first polymer and the second composition may include a second polymer, which may be the same or different polymers. The weight-average molecular weight of the first polymer may be 1.5 times or greater than that of the second polymer.

In some embodiments, the first polymer may include a compound having the structure in the Formula (1) and the second polymer may include a compound having the structure of Formula (2).

In some embodiments, ends of the second etch target layers may be formed to have a step formation.

In some embodiments, the resulting step formation of the structure including the first stack structure and the second stack structure is formed during a single-stage process.

DETAILED DESCRIPTION

Figure 1:
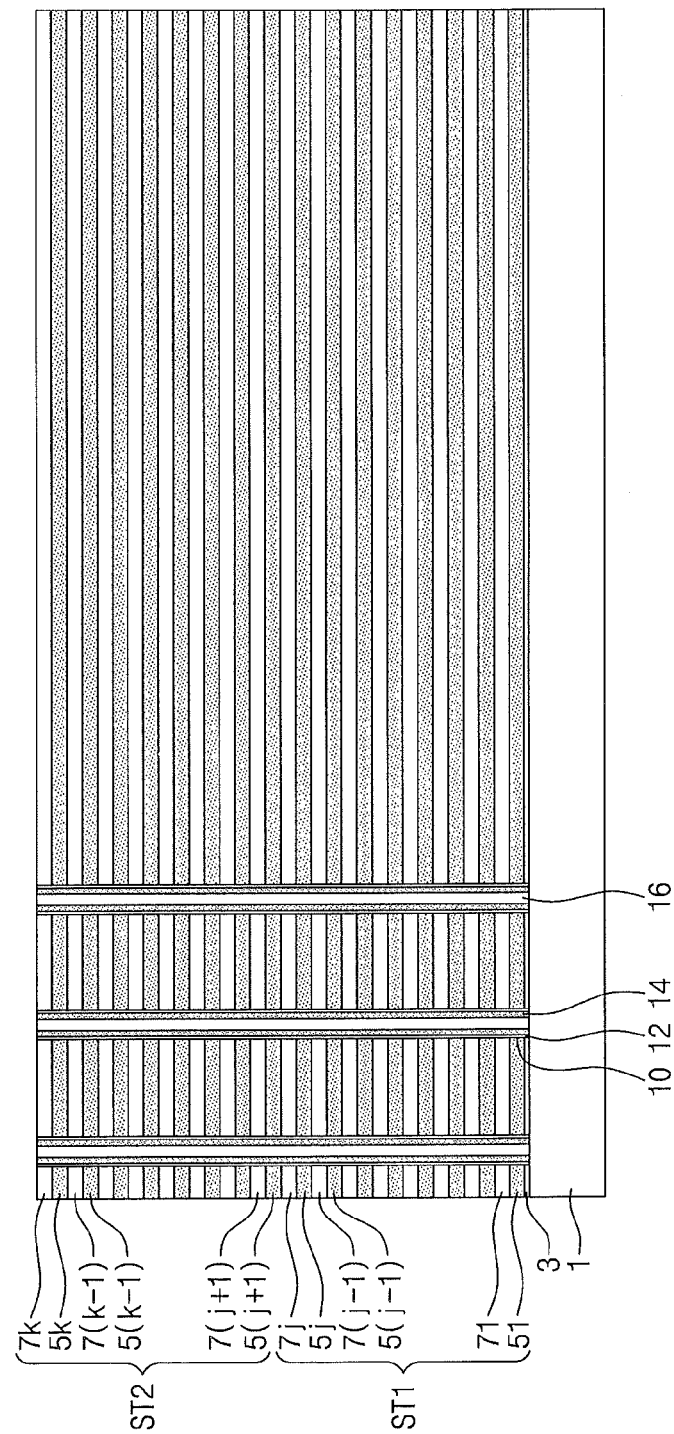
FIGS. 1 to 6, FIGS. 7A and 7B, and FIGS. 8 to 16 present cross-sectional views illustrating methods for fabricating a semiconductor device according to embodiments of the inventive concept.

The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

In the specification, it will be understood that when an element is referred to as being "on" another layer or substrate, it can be directly on the other element, or intervening elements may also be present. In the drawings, thicknesses of elements are exaggerated for clarity of illustration.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Exemplary embodiments of the invention will be described below with reference to cross-sectional views, which are exemplary drawings of the invention. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention. Though terms like a first, a second, and a third are used to describe various elements in various embodiments of the inventive concept, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concept will now be described more fully with reference to accompanying drawings.

FIGS. 1 to 6, FIGS. 7A and 7B, and FIGS. 8 to 16 provide cross-sectional views illustrating methods for fabricating a semiconductor device according to embodiments of the inventive concept.

Referring to FIG. 1, a pad oxide layer 3 is formed on a substrate 1. Sacrificial layers 51 to 5k and inter-gate dielectrics 71 to 7k are sequentially stacked on the pad oxide layer 3, The sacrificial layers 51 to 5k may be formed of a material having an etch selectivity with respect to the inter-gate dielectrics 71 to 7k. For example, the inter-gate dielectrics 71 to 7k may be formed of a silicon oxide-based material. For example, the sacrificial layers 51 to 5k may be formed of silicon nitride or polysilicon. The j sacrificial layers 51 to 5j and the j inter-gate dielectrics 71 to 7j may be stacked to constitute a first stack ST1, and the (k−j+1) the sacrificial layers 5(j+1) to 5k and the (k−j+1) inter-gate dielectrics 7(j+1) to 7k may be stacked to constitute a second stack ST2, where k may be an integer greater than 6. The sacrificial layers 51 to 5k, the inter-gate dielectrics 71 to 7k, and the pad oxide layer 3 may be successively patterned such that a plurality of active holes 10 is formed to expose the substrate 1. A gate insulating layer 12 and an active layer 14 are formed to sequentially cover the sidewall of each of the active holes 10. A first filing insulating layer 16 is formed to fill the active hole 10. The gate insulating layer 12 may include at least a tunnel oxide layer. The gate insulating layer 12 may further include a data storage layer and a blocking insulating layer. The active layer 14 may be formed of undoped polysilicon or semiconductor material. The first filling insulating layer 16 may be formed of a silicon oxide-based material.

Figure 2:
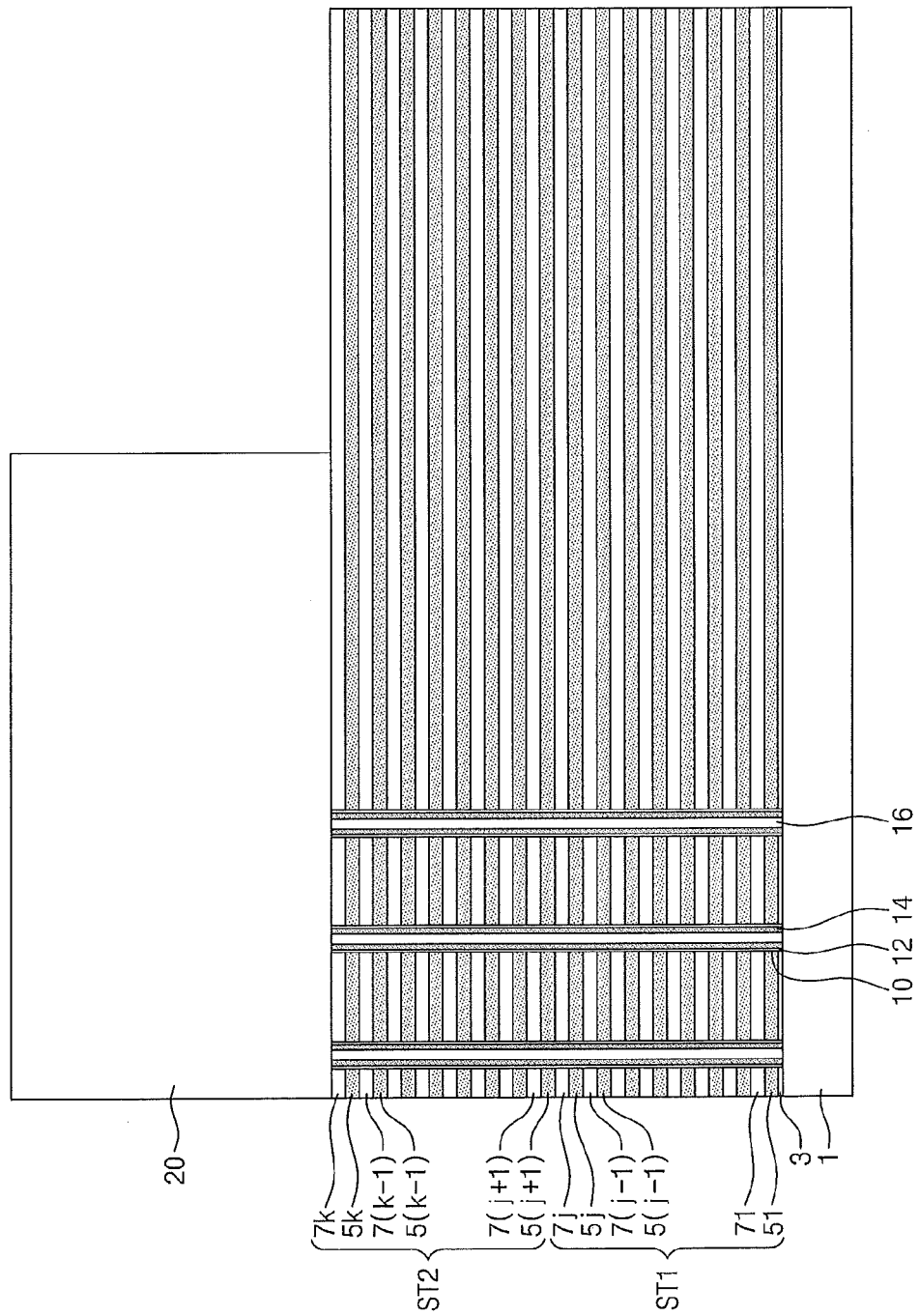

Referring to FIG. 2, a first hard mask pattern 20 is formed on the second stack ST2 to cover the active holes 10. For example, the first hard mask pattern 20 may be formed of a photoresist pattern by means of photolithography. In FIG. 2, since a top surface of the second stack ST2 interacts with the first hard mask pattern 20, the form of the first hard mask pattern 20 may be exactly made.

Figure 3:
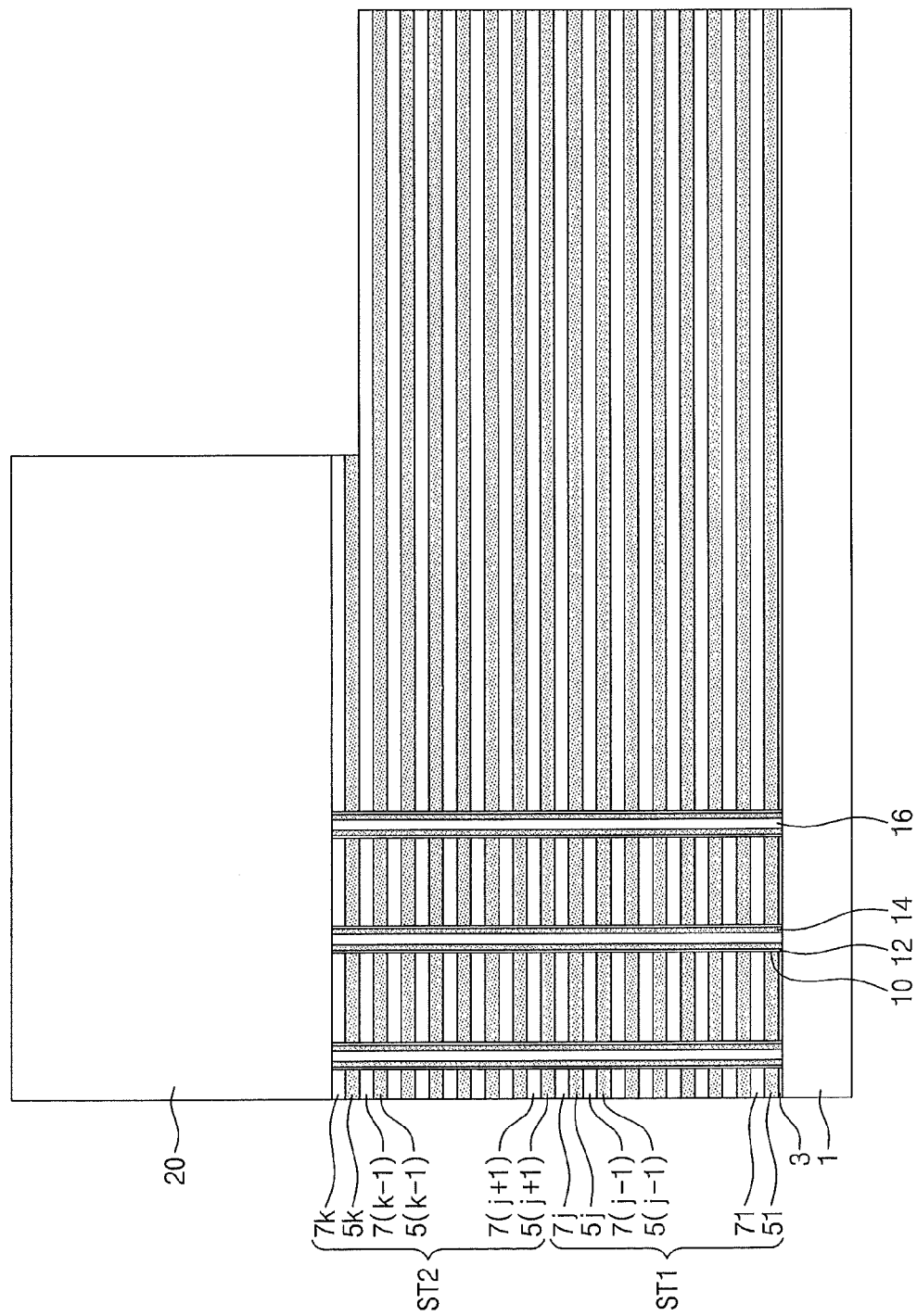

Referring to FIG. 3, the uppermost $k^{th}$ inter-gate dielectric 7k and the uppermost sacrificial layer 5k of the second stack ST2 are successively etched using the first hard mask pattern 20 as an etch mask to expose the underlying $(k-1)^{th}$ inter-gate dielectric 7(k−1).

Figure 4:
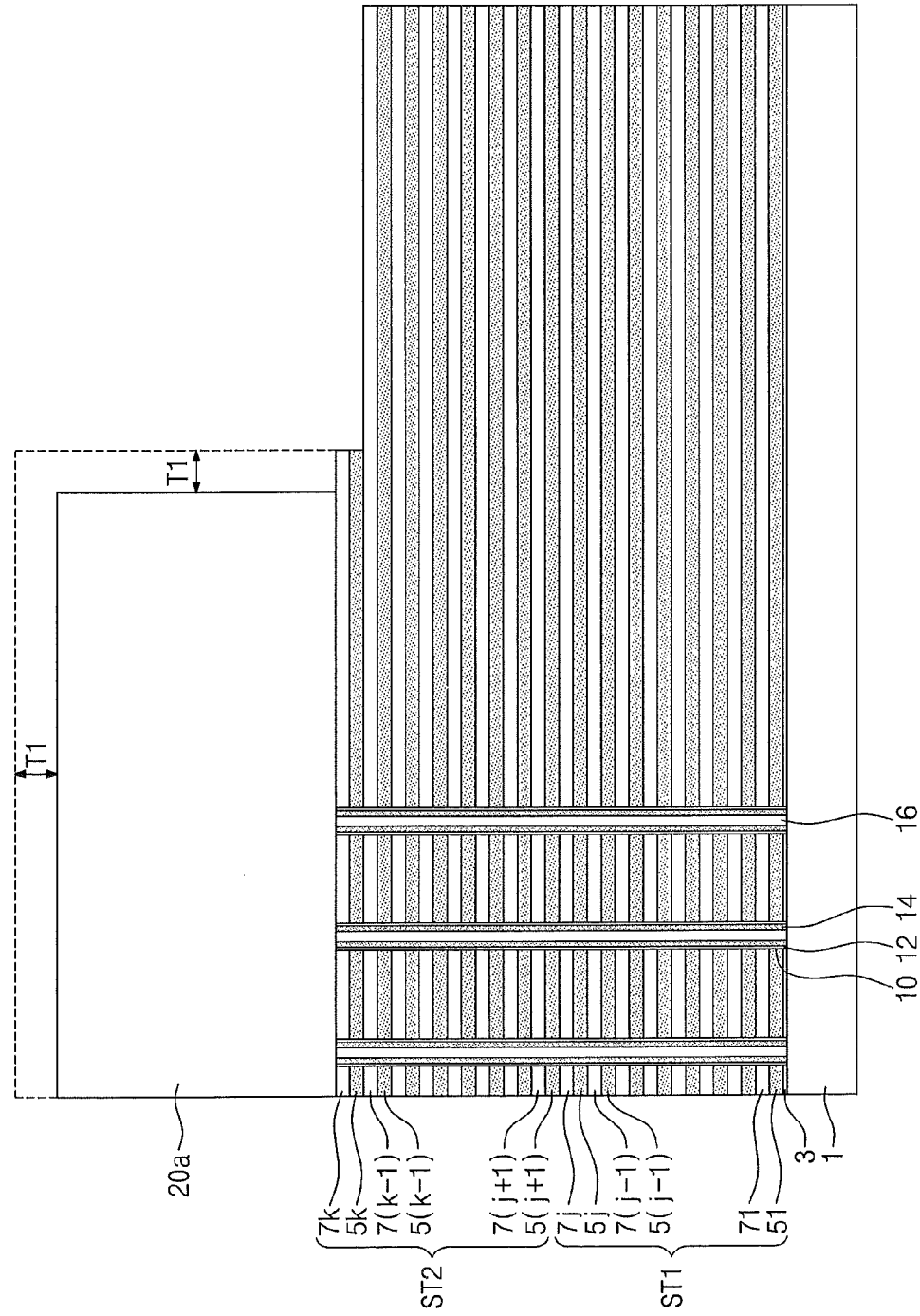

Referring to FIG. 4, a trim process is performed on the first hard mask pattern 20. That is, an isotropic etch process is performed on the first hard mask pattern 20. Thus, the size of the first hard mask pattern 20 is reduced. More specifically, a lateral portion and an upper portion of the first hard mask pattern 20a are reduced by a first thickness T1. The isotropic etch process performed on the first hard mask pattern 20 may use oxygen. The first thickness T1 may be 100 nanometers or greater.

Figure 5:
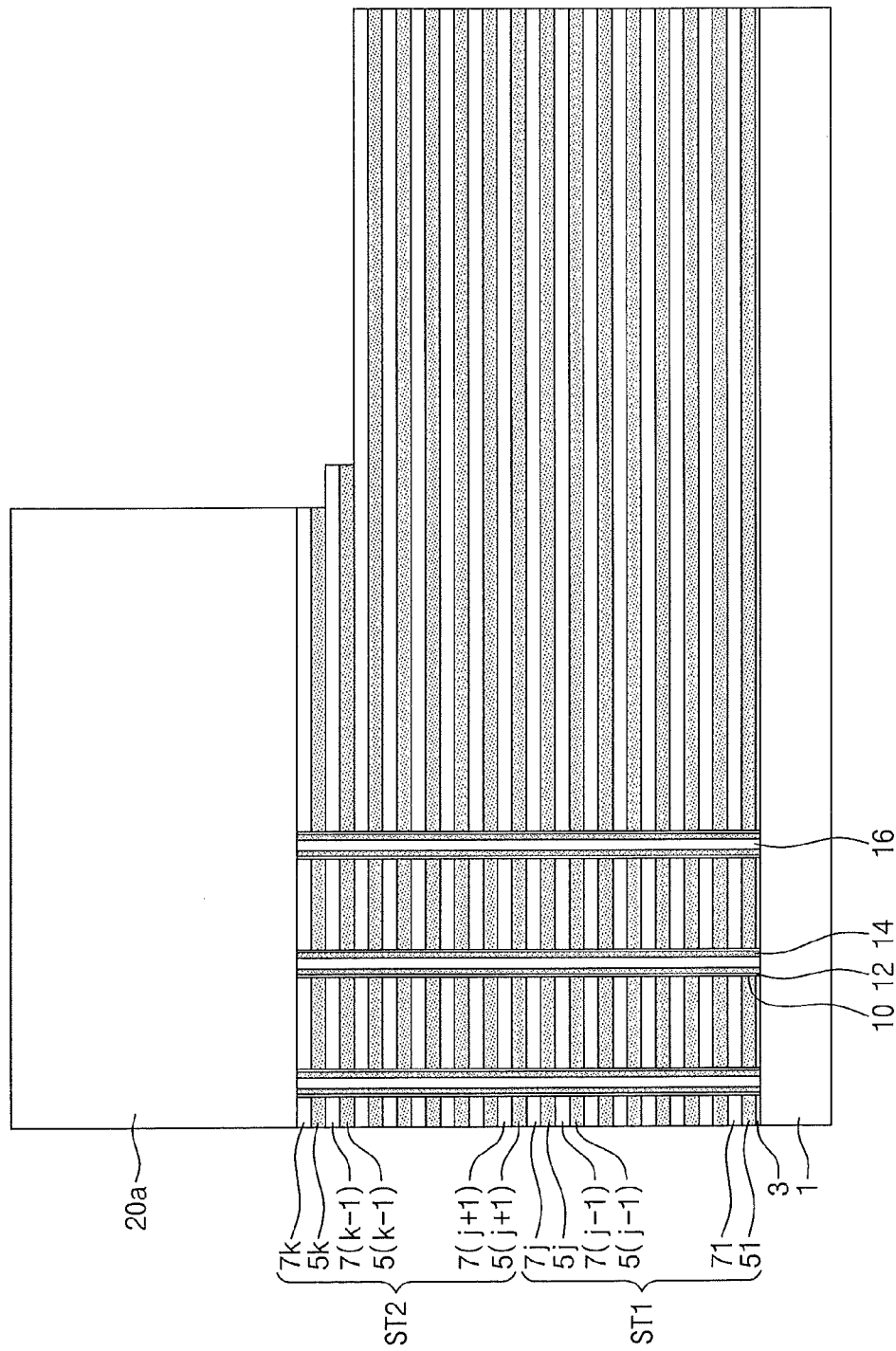

Referring to FIG. 5, an anisotropic etch process is performed on the second stack ST2 using the first hard mask pattern 20a, whose size is reduced once, as an etch mask. Thus, uppermost $k^{th}$ inter-gate dielectric 7k and the uppermost sacrificial layer 5k of the second stack ST2 are etched and simultaneously the exposed $(k-1)^{th}$ inter-gate dielectric 7(k−1) and the underlying $(k-1)^{th}$ sacrificial layer 5(k−1) are etched.

Figure 6:
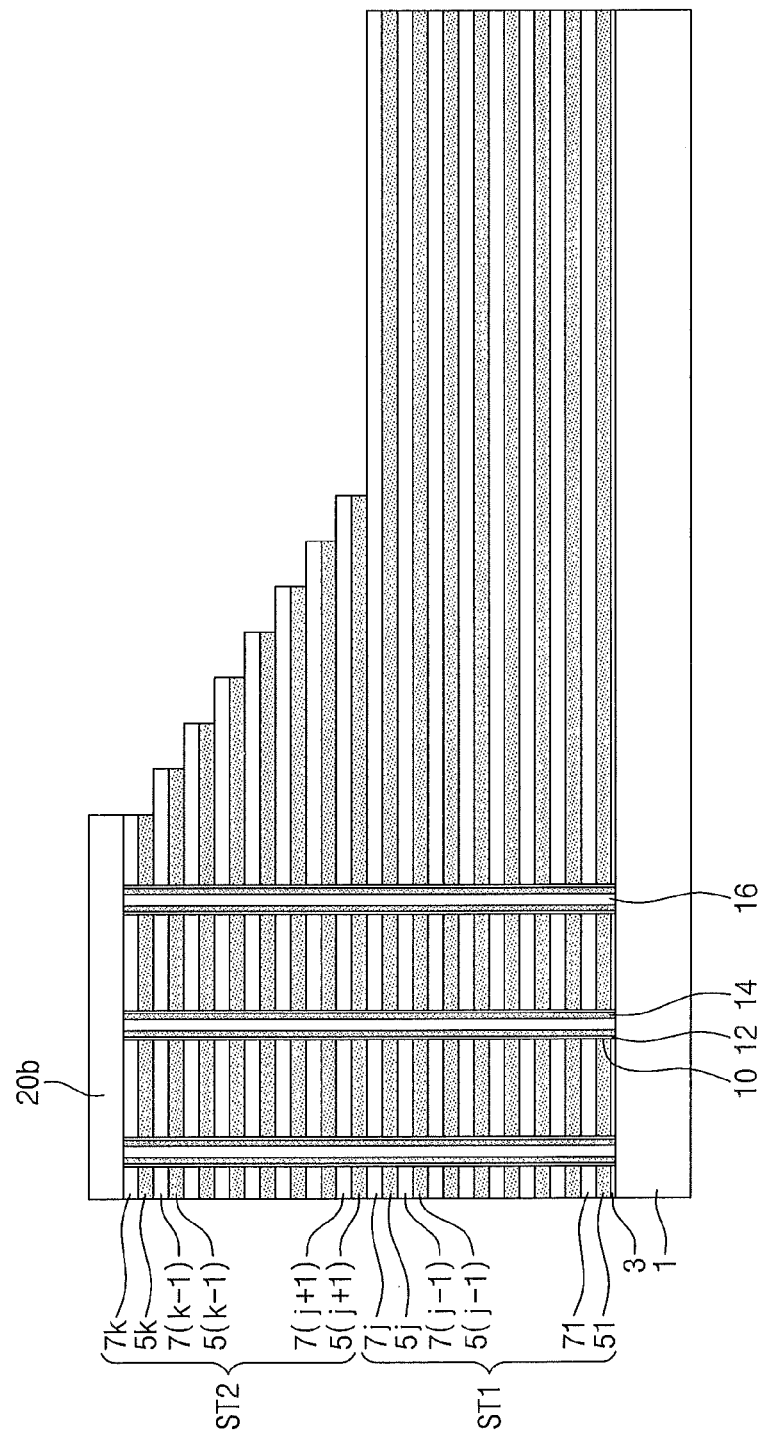

Referring to FIG. 6, the procedure of re-performing an isotropic etch process on the first hard mask pattern 20a and anisotropically etching the second stack ST2 using the same is repeated. This repetition may be continued until the lowermost inter-gate dielectric 7(j+1) and the lowermost sacrificial layer 5 (j+1) of the second stack ST2 are etched to expose the top surface of the first stack ST1. Thus, ends of the gate inter-gate dielectrics 7(j+1)~7k and the sacrificial layers 5 (j+1)~5k of the second stack ST2 may be in the form of a step. In addition, the size of the first hard mask patterns 20b may be significantly reduced.

Figure 7A:
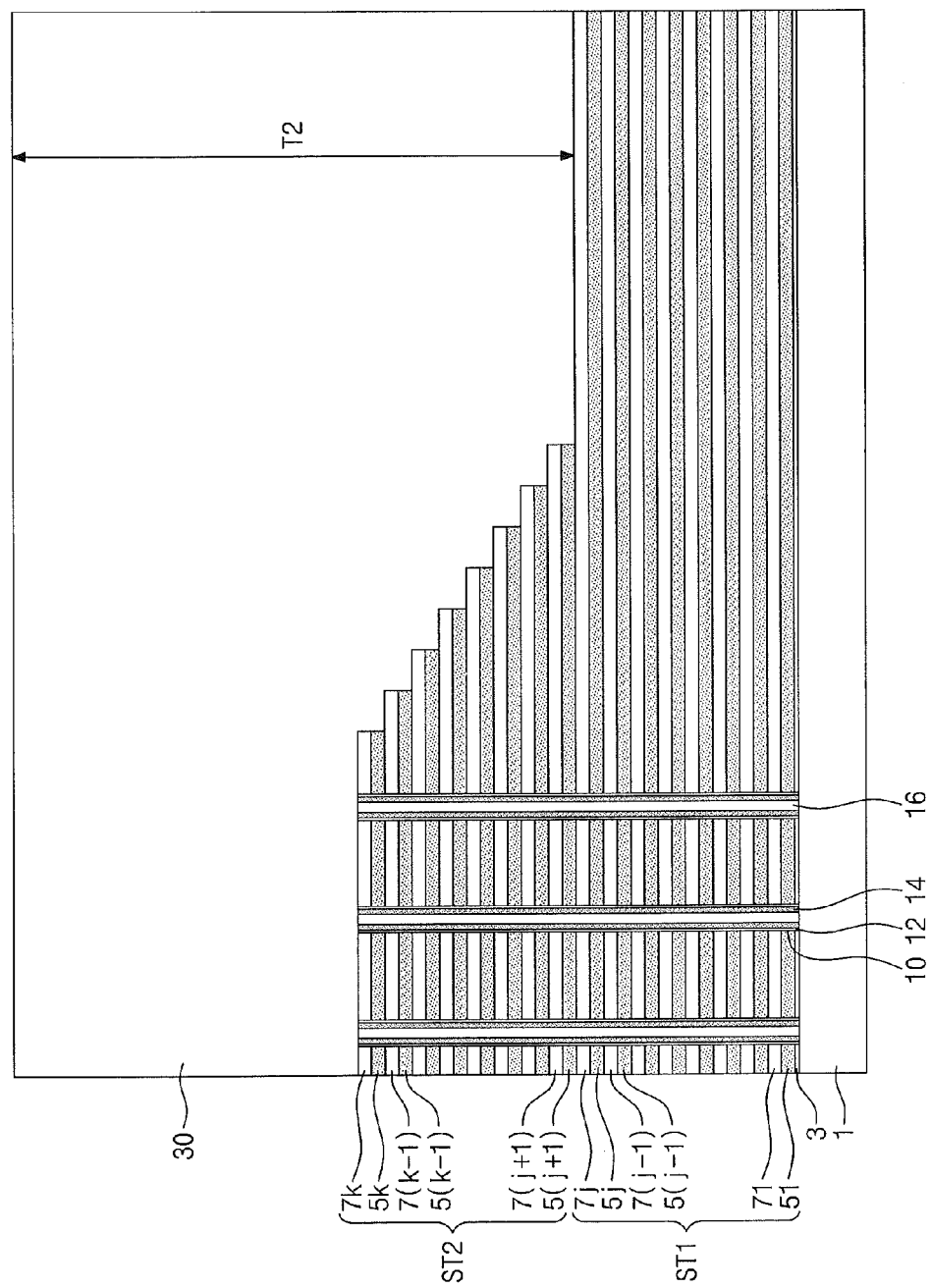
Figure 7B:
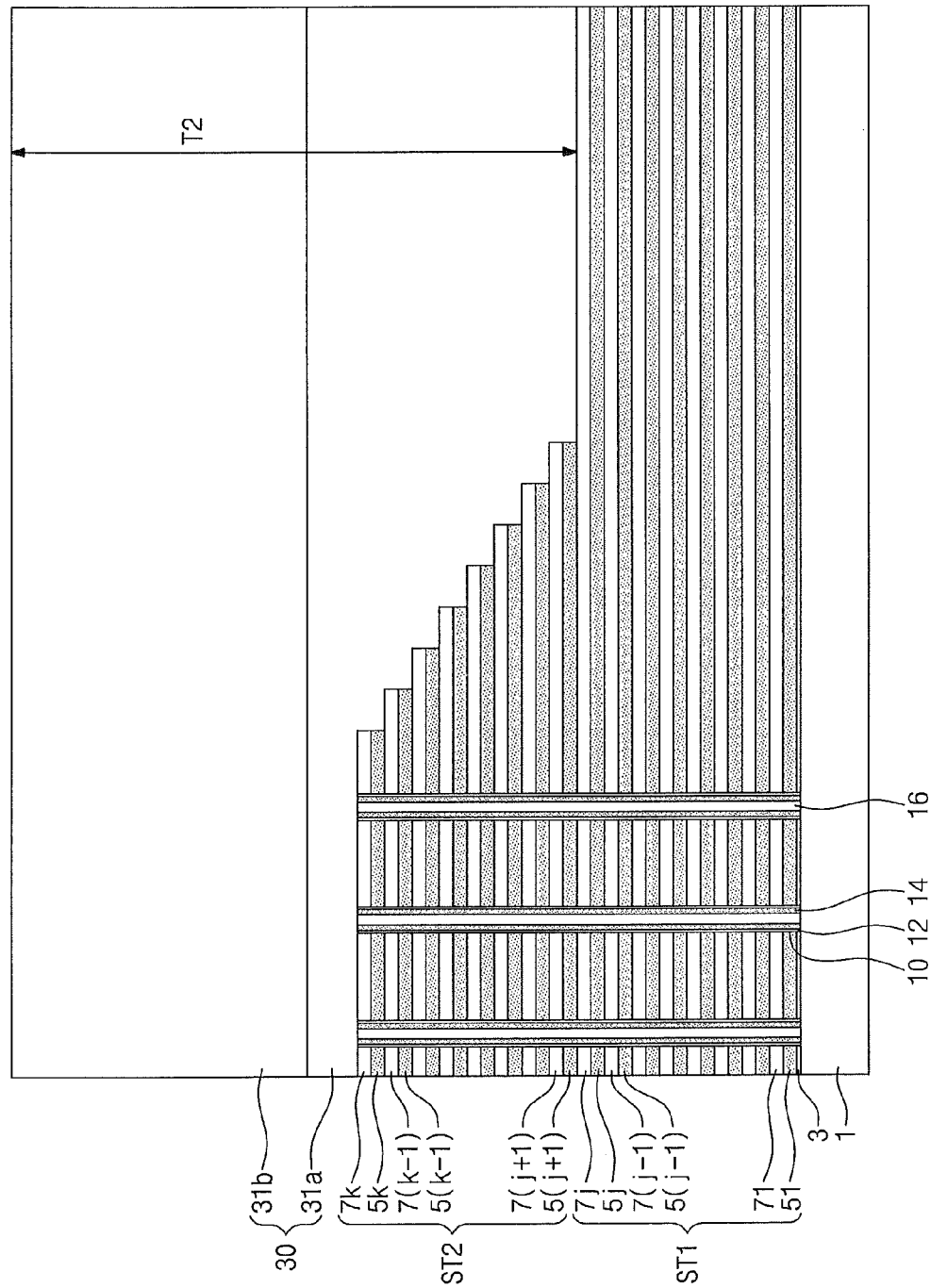

Referring to FIGS. 7A and 7B, the first hard mask pattern 20b is removed to expose the top surface of the second stack ST2. Thus, a lower structure stepped by a difference between heights of the first stack ST1 and the second stack ST2 is formed. The first stack ST2 is patterned on the lower structure to form a second hard mask layer 30. The second hard mask layer 30 must be thick enough to etch the first stack ST1 while having superior step coverage. The second thickness T2 of the second hard mask layer 30 from the top surface of the first stack ST1 to the top surface of the second hard mask layer 30 may be about 5 micrometers.

The procedure of forming the second hard mask layer 30 will now be explained below in detail.

Referring to FIG. 7A, according to an exemplary embodiment of the inventive concept, a first composition is coated on the lower stepped structure and then cured. The first composition may include a first polymer for improving planarization and a second polymer suitable for increasing thickness. The first polymer has a greater weight than the second polymer. The weight-average molecular weight of the first polymer may be 1.5 times or greater than that of the second polymer. Thus, since the first polymer has relatively greater weight, it may improve the degree of planarization while sinking to a lower end when the first composition is coated. An ultrasonic wave may be applied to the first composition at least when the first composition is coated and/or when the first composition is cured. Thus, vibration is applied to the first composition such that a low-stepped area may be easily filled with the first composition to improve the degree of planarization.

The first composition may include a compound of Formula (1) below.

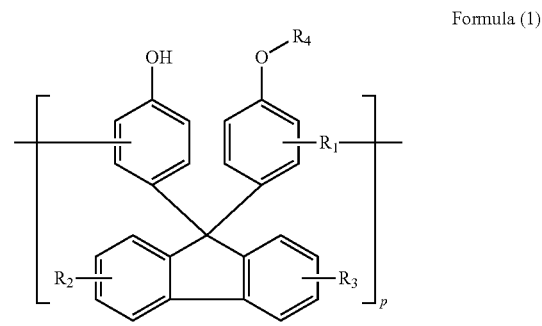

Formula (1)

In Formula (1), p is an integer ranging from 100 to 3000, $R_1$ is a methylene or an arylene; $R_2$ and $R_3$ are hydroxyl group, halogen or hydrocarbon having 0 to 19 carbons, respectively; and $R_4$ is $C_1$-$C_{19}$ alkyl group or aromatic cyclic compound.

The first composition may include a compound of Formula (2) below.

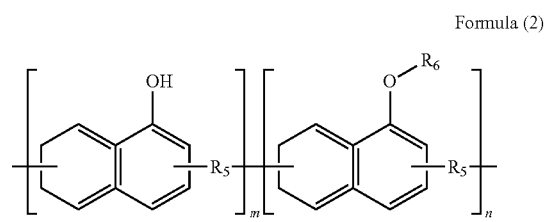

Formula (2)

In Formula (2), n+m is an integer ranging from 100 to 3000; $R_5$ is a methylene or an arylene; and $R_6$ is $C_1$-$C_{19}$ alkyl group or aromatic cyclic compound.

The first composition may further include a surfactant, which may be a cationic, anionic or non-ionic surfactant. The anionic surfactant may include a sulfonic acid-based surfactant, a carboxyl acid-based surfactant, and a phosphate-based surfactant. The non-ionic surfactant may include ethylene oxide (EO) unit (—$CH_2CH_2O$—).

The surfactant may be at least one of DBS (dodecylbenzene sulfonic acid)[$C_{12}H_{25}C_6H_4SO_3H$], polyoxyethylene (23) lauryl ether)[$C_{12}H_{25}(OCH_2CH_2)_{23}OH$], polyethylene glycol sorbitan monolaurate, polyoxyethylene isooctylphenyl ether [$CH_3(CH_2)_x(OCH_2CH_2)_yOCH_2COOH$, where x is 11 to 13, and y is 3 to 10], and $CF_3(CF_2CF_2)_n(CH_2CH_2O)_yH$, where n is 2 to 4 and y is 3 to 10.

The surfactant may be present in an amount ranging from 0.01 ppm to 1000 ppm with respect to the total weight of the first composition.

Referring to FIG. 7B, according to another embodiment of the inventive concept, the second hard mask layer 30 may include a first sub-mask layer 31a and a second sub-mask layer 31b that are sequentially stacked. Both the first sub-mask layer 31a and the second sub-mask layer 31b may have level top surfaces. In this embodiment, the procedure of forming the second hard mask layer 30 is as follows. A second composition is coated on the lower stepped structure and then cured to form the first sub-mask layer 31a. A third composition is coated on the first sub-mask layer 31a and then cured to form the second sub-mask layer 31b. The second composition may contain the first polymer explained with reference to FIG. 7A, and the third composition may contain the second polymer explained with reference to FIG. 7A. Of the second and third compositions, at least the second composition may further include the surfactant explained with reference to FIG. 7A. An ultrasonic wave may be applied to the second composition at least one of when the second composition is coated or when the second composition is cured. An ultrasonic wave may be applied to the third composition at least one of when the third composition is coated or when the third composition is cured.

Figure 8:
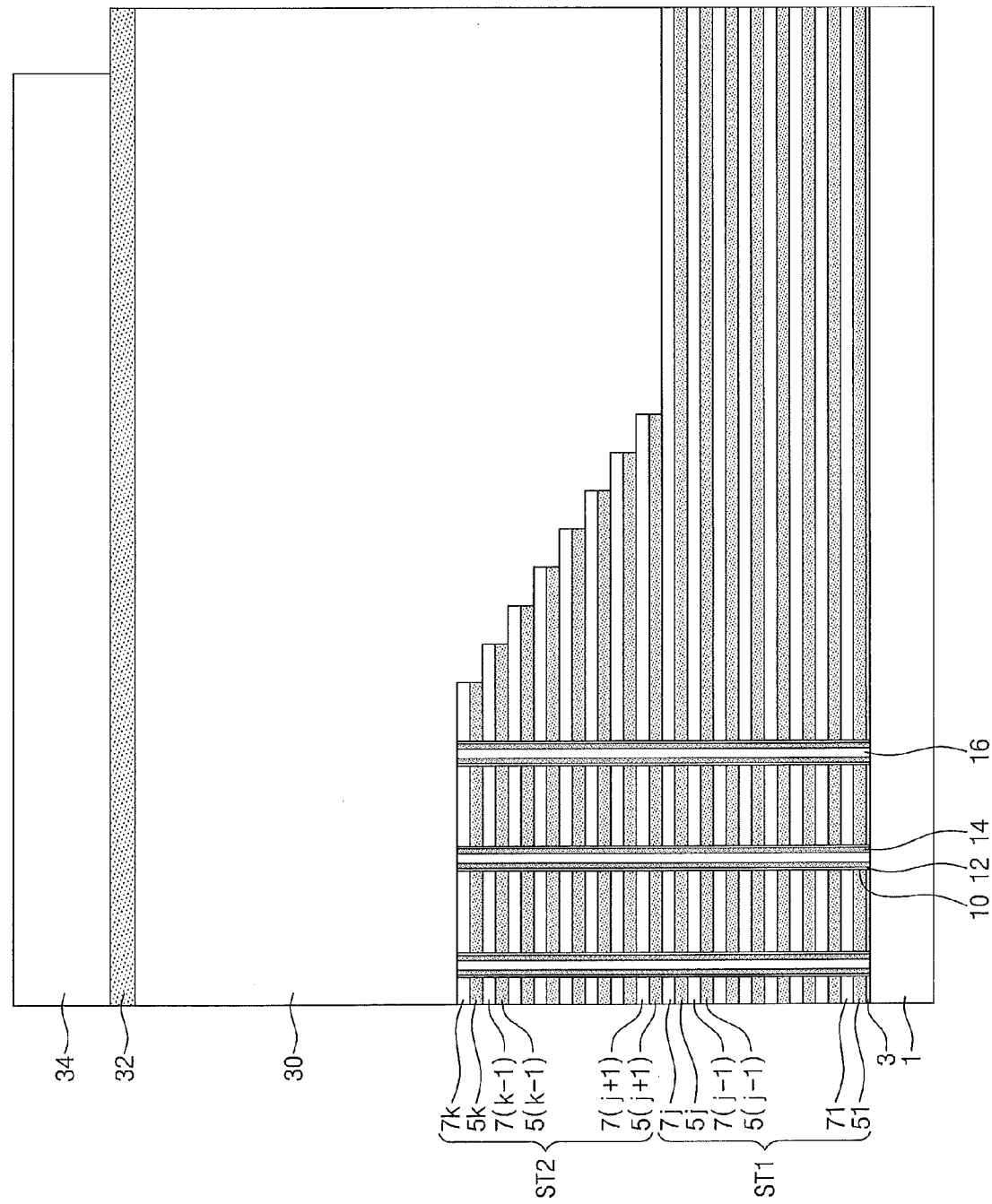

Referring to FIG. 8, a third mask layer 32 is formed on the second hard mask layer 30. The third hard mask layer 32 may include an etching-target layer, i.e., materials included in the inter-gate dielectrics 71~7j and the sacrificial layers 51~5j constituting the first stack ST1. For example, the third hard mask layer 32 may be a single layer of silicon oxynitride (SiON) or a double layer of silicon oxide and silicon nitride. If the sacrificial layers 51~5j are formed of polysilicon, the third hard mask layer 32 may be a double layer of silicon oxide and polysilicon. A fourth hard mask layer 34 is formed on the third hard mask layer 32. The fourth hard mask layer 34 may be formed of a photoresist pattern by means of photolithography. Since the planarization is performed by the second hard mask layer 30, the photoresist pattern may be precisely formed.

Figure 9:
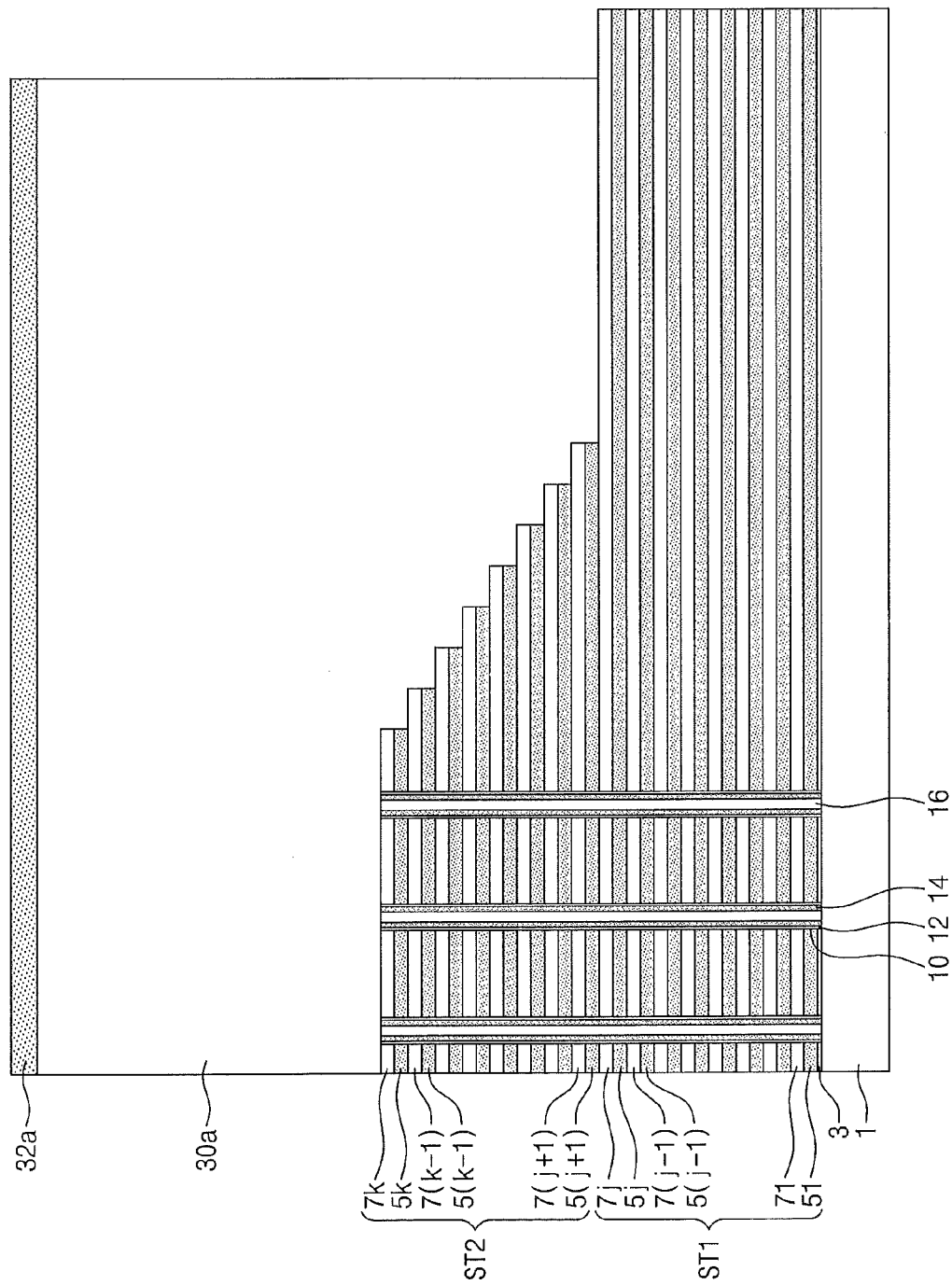

Referring to FIG. 9, the third hard mask layer 32 and the second hard mask layer 30 are successively patterned using the fourth hard mask pattern 34 as an etch mask to form a second hard mask pattern 30a and a third hard mask pattern 32a. During formation of the second hard mask pattern 30a, the fourth hard mask pattern 34 may be fully removed and a top surface of the third hard mask pattern 32a may be exposed. The third hard mask pattern 32a may act as an etch-stop layer. The second hard mask pattern 30a may be formed to expose at least a portion of the top surface of the first stack ST1.

Figure 10:
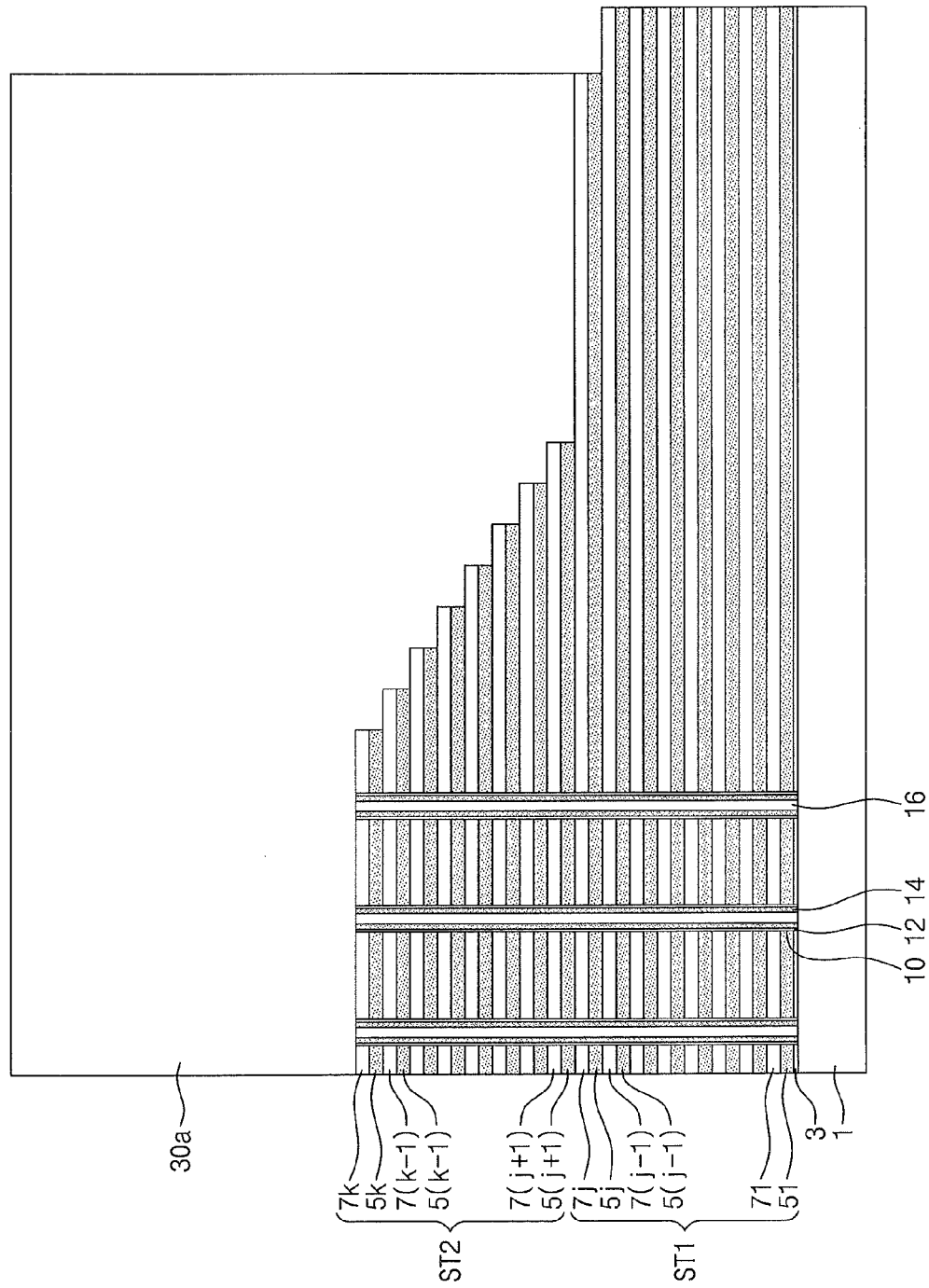

Referring to FIG. 10, the third hard pattern 32a is removed to expose a top surface of the second hard mask pattern 30a. At the same time, the exposed uppermost $j^{th}$ inter-gate dielectric 7j and the exposed uppermost $j^{th}$ sacrificial layer 5j of the first stack ST1 are etched, and at least a portion of a top surface of the underlying $(j-1)^{th}$ inter-gate dielectric 7(j−1) is exposed. Thus, process steps may be reduced.

Figure 11:
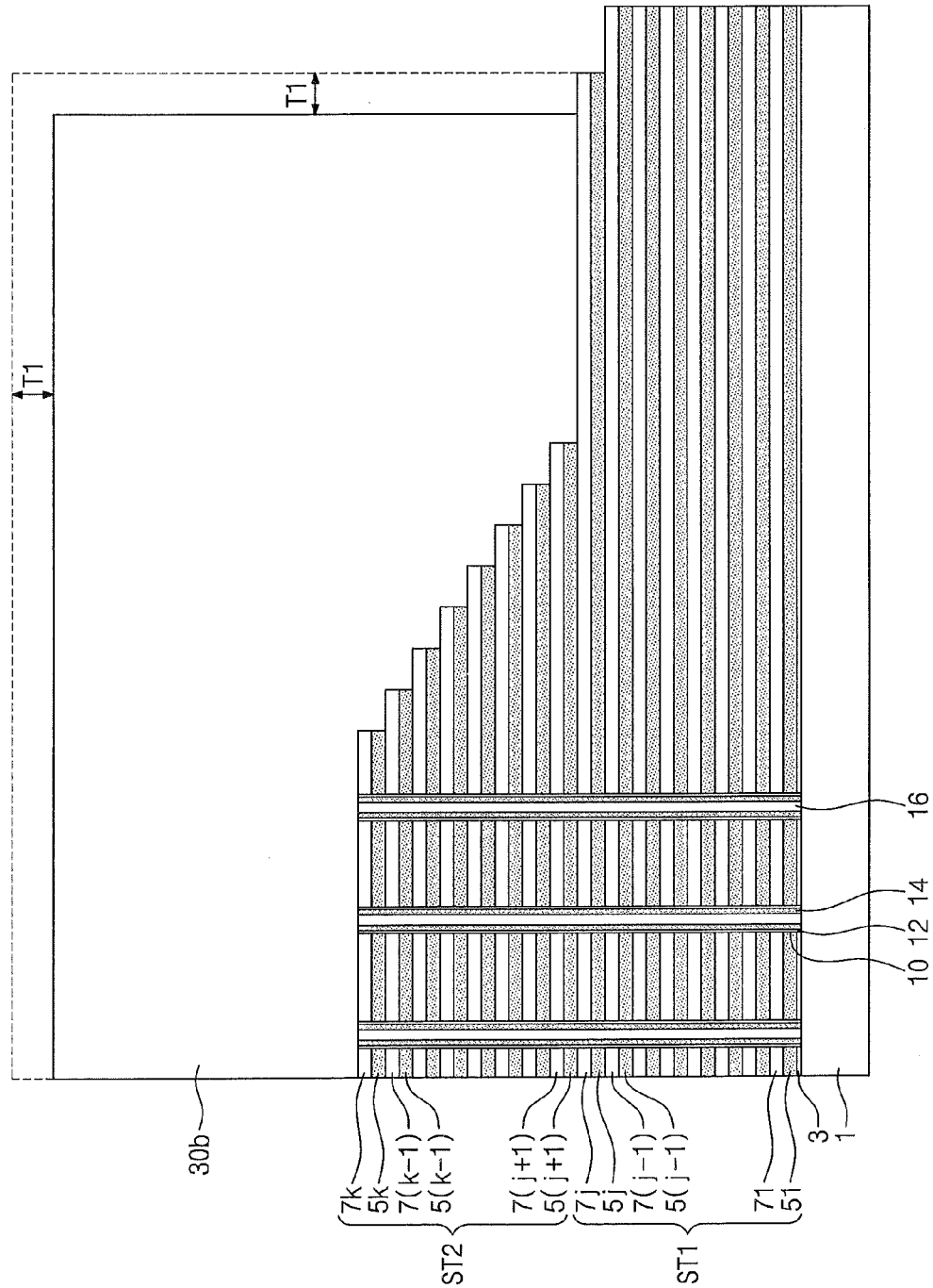

Referring to FIG. 11, a trim process is performed on the second hard mask pattern 30a. That is, an isotropic etch process is performed on the second hard mask pattern 30a to reduce a size of the second hard mask pattern 30a. More specifically, a lateral portion and an upper portion of the second hard mask pattern 30b are reduced by a first thickness T1. The isotropic etch process performed on the second hard mask pattern 30a may use oxygen. The first thickness T1 may be 100 nanometers or more.

Figure 12:
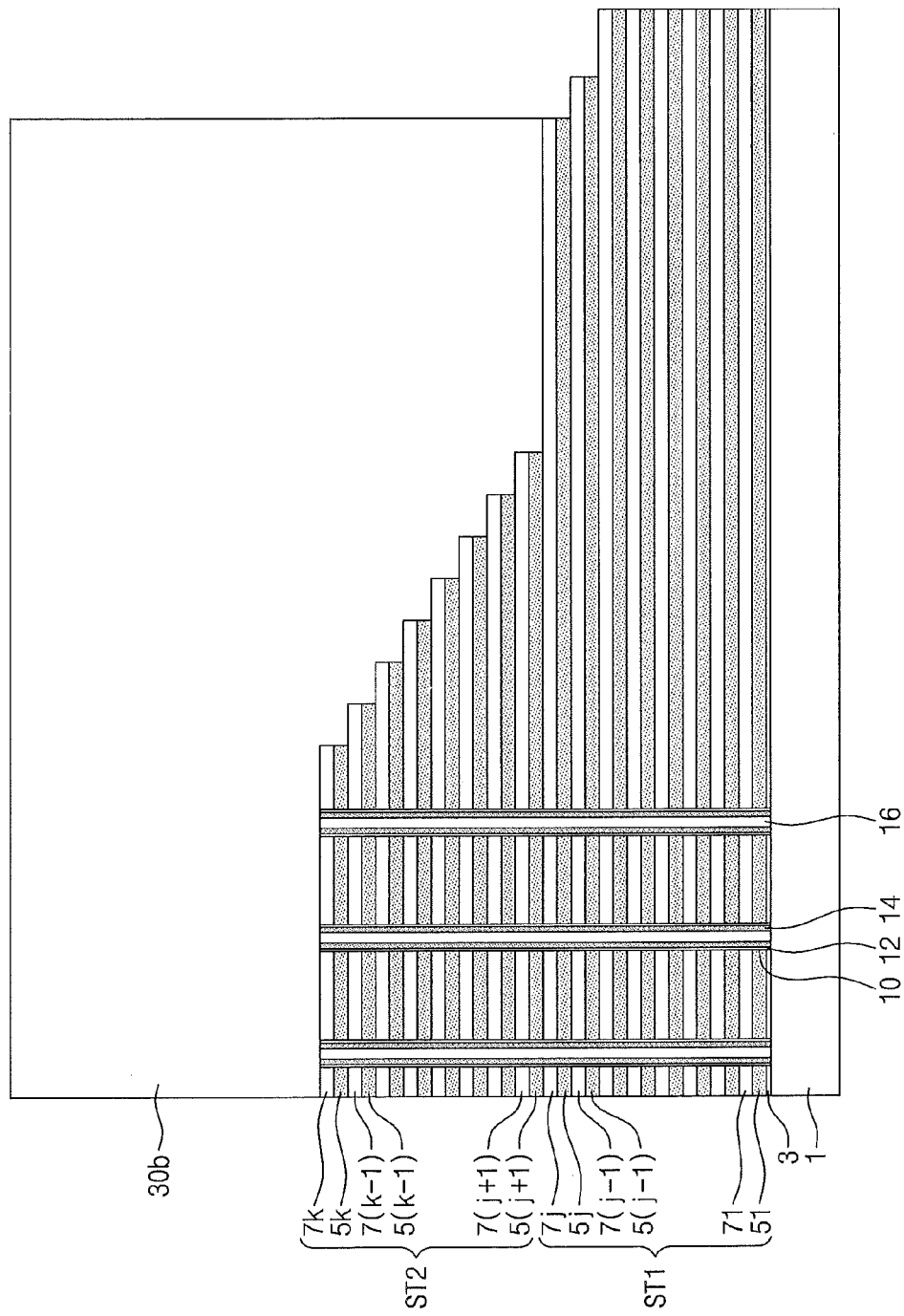

Referring to FIG. 12, an anisotropic etch process is performed on the first stack ST1 using the second hard mask pattern 30b, which size is reduced once, as an etch mask. Thus, the uppermost $j^{th}$ inter-gate dielectric 7j and the uppermost $j^{th}$ sacrificial layer 5j of the first stack ST1 are etched and simultaneously the exposed $(k−1)^{th}$ inter-gate dielectric 7(k−1) and the underlying $(k−1)^{th}$ sacrificial layer 5(k−1) are etched.

Figure 13:
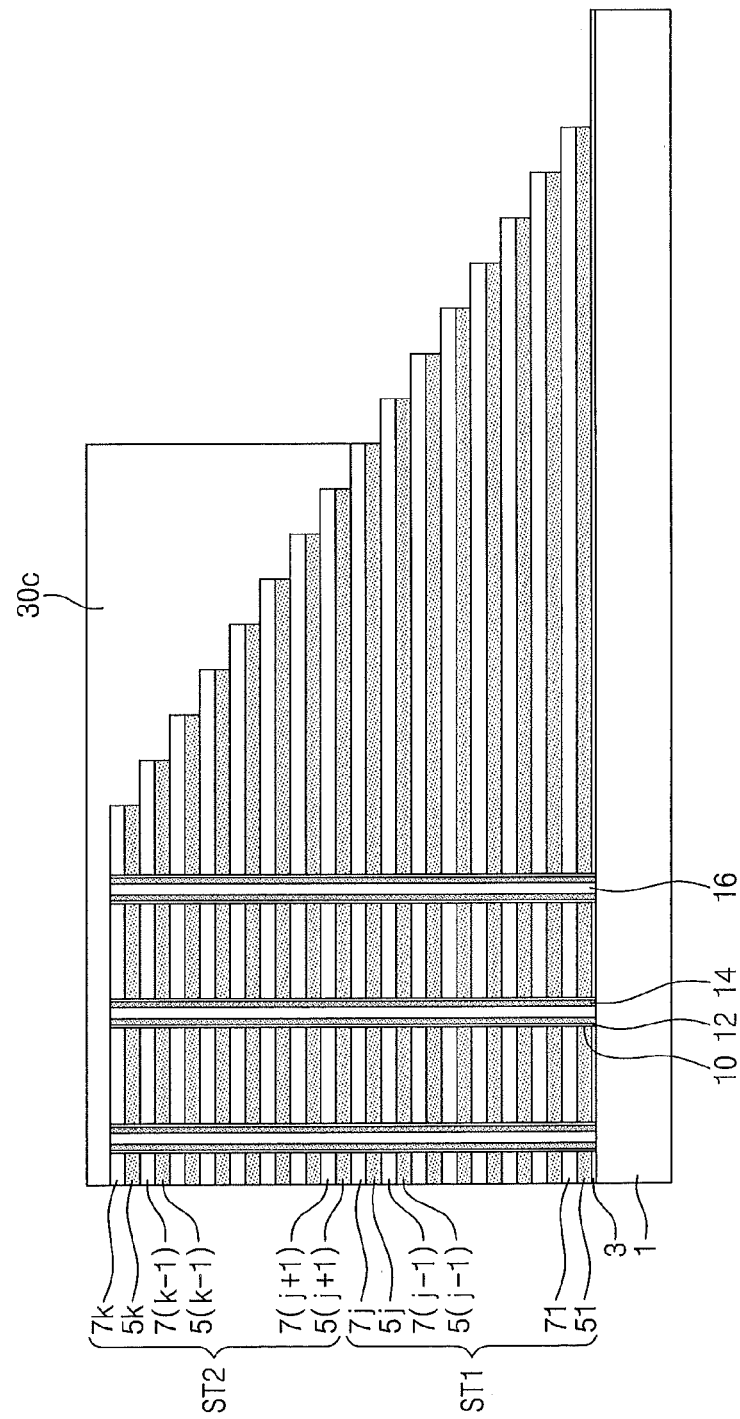

Referring to FIG. 13, the procedure of re-performing an isotropic etch process on the second hard mask pattern 30b and anisotropically etching the first stack ST1 using the same is repeated. This repetition may be continued until the lowermost inter-gate dielectric 71 and the lowermost sacrificial layer 51 of the first stack ST1 are etched to expose at least a portion of a top surface of the pad oxide layer 3. Thus, ends of the gate inter-gate dielectrics 71~7j and the sacrificial layers 51~5j of the first stack ST1 may be in the form of a step. In addition, the size of the second hard mask patterns 30c may also be significantly reduced.

Figure 14:
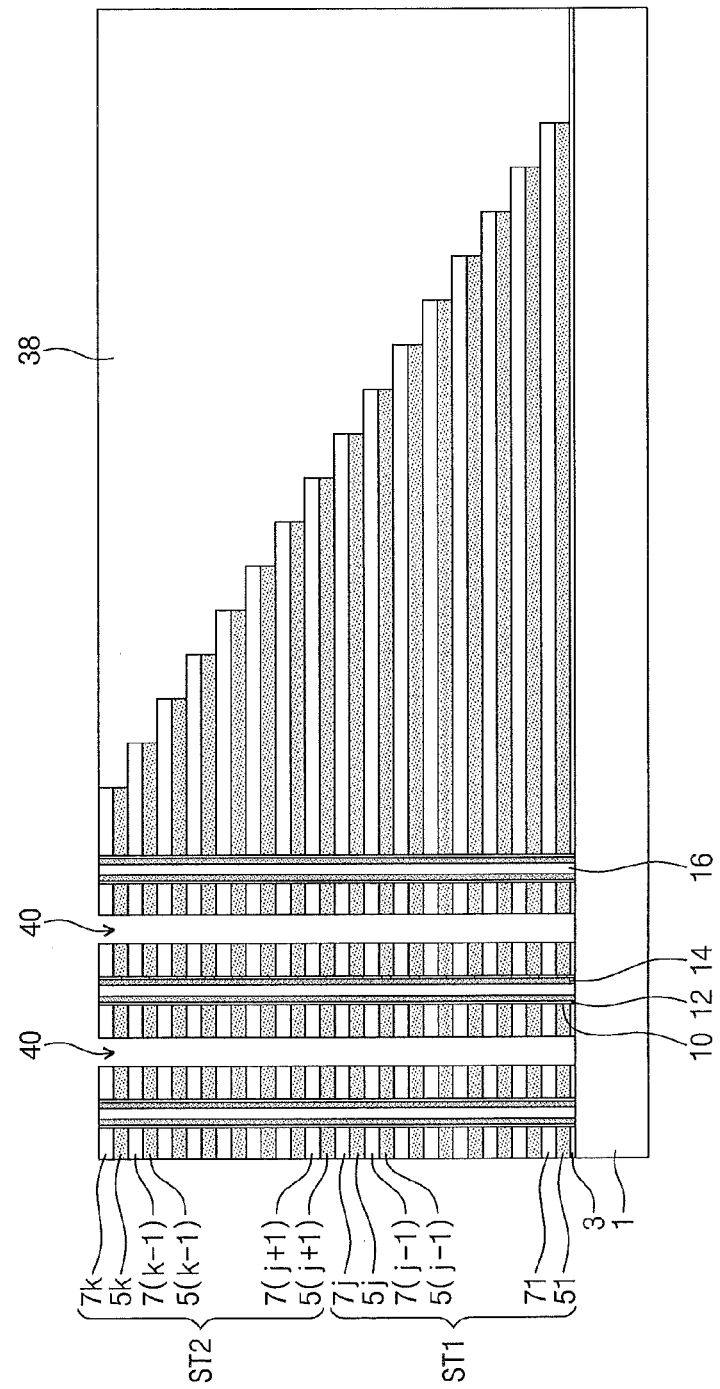

Referring to FIG. 14, the second hard mask pattern 30c is removed. An external insulating layer 38 is stacked on the substrate 1 to cover the ends of the inter-gate dielectrics 71~7k and the sacrificial layers 51~5k. The external insulating layer 38 is planarized to expose the top surface of the second stack ST2. At a position spaced apart from the inter-gate dielectric 71~7k and the sacrificial layers 51~5k, the inter-gate dielectric 71~7k, the sacrificial layers 51~5k, and the pad oxide layer 3 are successively patterned to form linear grooves 40 extending in one direction.

Figure 15:
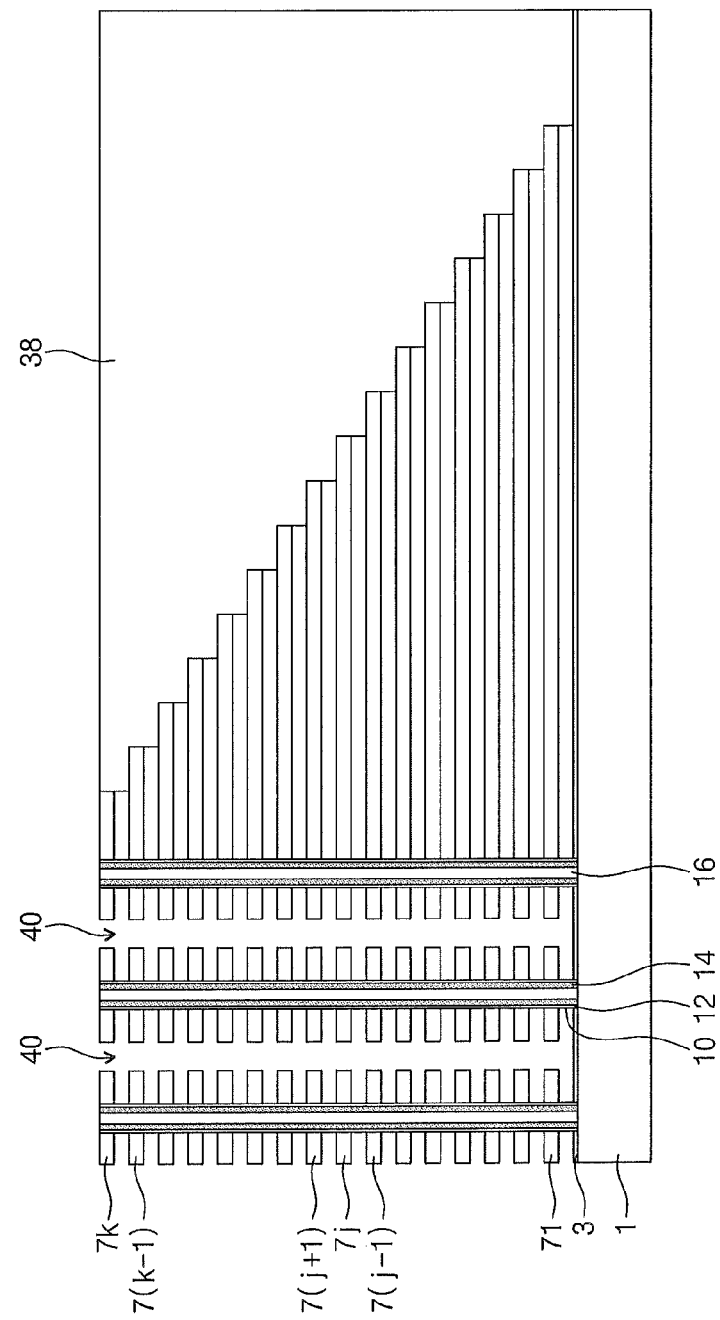

Referring to FIG. 15, the sacrificial layers 51~5k are removed through the grooves 40. Thus, sidewall and top and bottom surfaces of the inter-gate dielectrics 71~7k, sidewall of the gate insulating layer 10, and sidewall of the external insulating layer 38 may be exposed.

Figure 16:
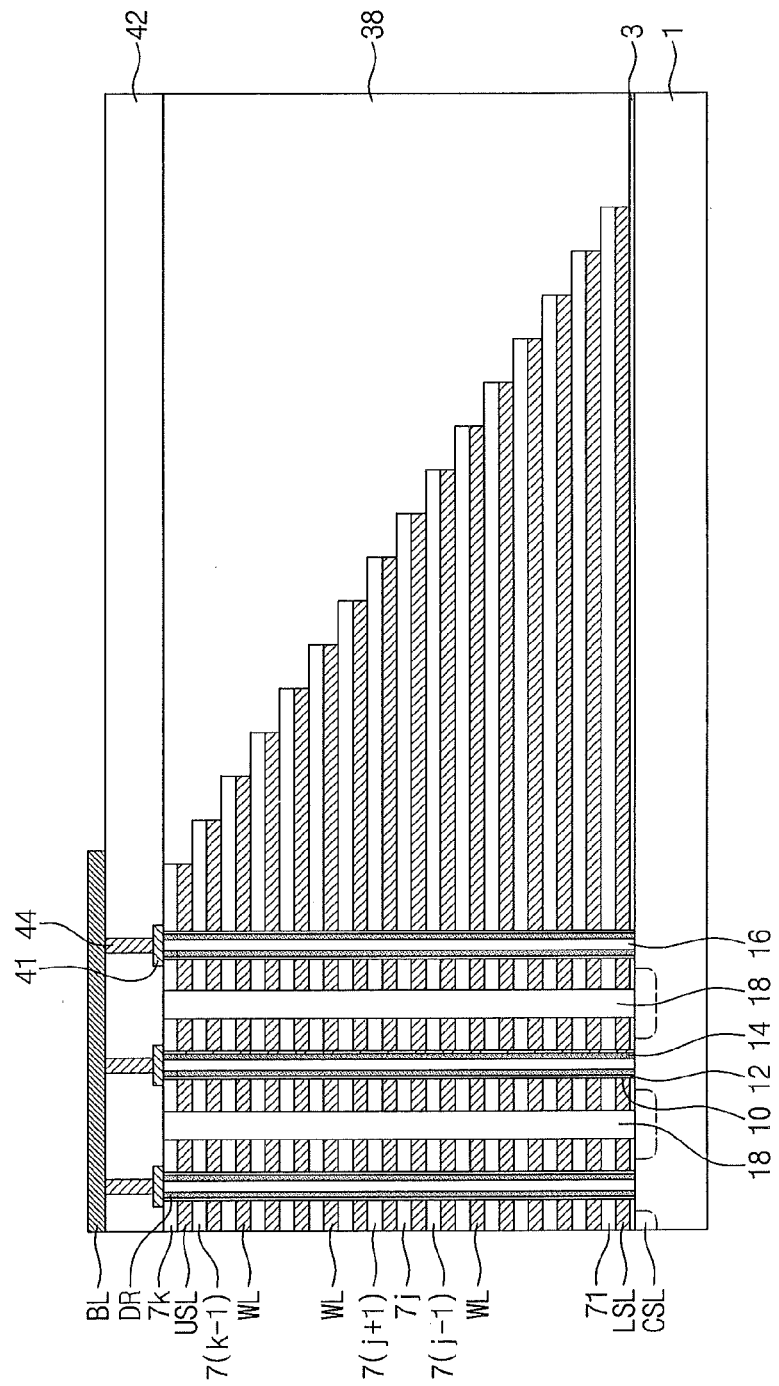

Referring to FIG. 16, a common source line CSL is formed in the substrate 1 exposed through the grooves 40 by means of ion implantation. A conductive layer is stacked to fill all regions in which the sacrificial layers 51~5k were present. The conductive layer in the grooves 40 is removed, and the grooves 40 are filled with a second filling insulating layer 18. Thus, a lower selection line LSL, wordlines WL, and an upper selection lines USL may be formed. A drain region DR is formed at an upper portion of the active layer 14 by means of ion implantation. Conductive pads 41 are formed to be in contact with an upper end of the active layer 14. An upper insulating layer 42 is formed to cover the conductive pads 41 and the external insulating layer 38. Contact plugs 44 are formed to be in contact with the conductive pad 40 through the upper insulating layer 42. Linear bitlines BL are formed on the upper insulating layer 42 to intersect the second filing insulating layer 18.

A semiconductor device in FIG. 16 may be a vertical nonvolatile memory device, specifically a vertical flash memory device.

The methods for fabricating a semiconductor device according to the inventive concept may prevent formation of a defective pattern resulting from a difference in focal depth during a photolithography process at least because a second hard mask layer 30 having a level top surface is formed on the lower stepped structures ST1 and ST2 and a photoresist pattern 34 is formed on the second hard mask layer 30. If a photoresist pattern is formed directly on the stepped structure, it may be difficult to form a precise pattern. Therefore, the distribution of sizes of finally formed patterns may be large. However, the present inventive concept may minimize the distribution.

In addition, the methods for fabricating a semiconductor device according to the inventive concept may minimize formation of photoresist patterns to reduce fabrication cost.

In the methods for fabricating a semiconductor device according to the inventive concept, since the uppermost etch target layers 7j and 5j are removed simultaneously to form the third hard mask pattern 32a, the number of procedures for the entire process may decrease. Thus, process simplification may be achieved.

Figure 17:
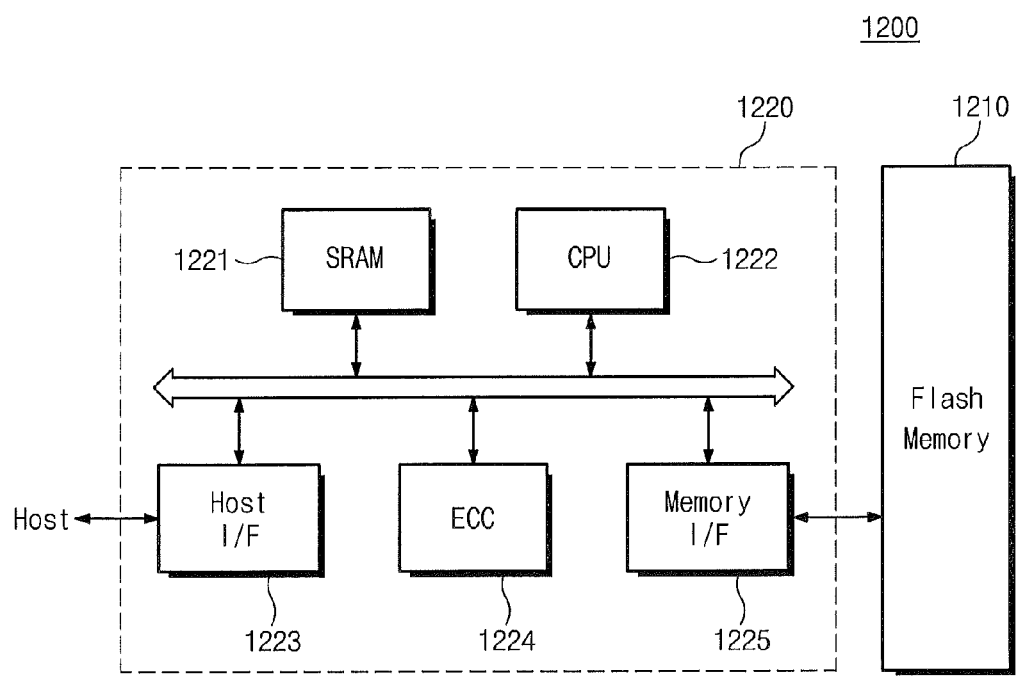
FIG. 17 is a block diagram showing an example of a memory card including a flash memory device according to the inventive concept.

FIG. 17 is a block diagram showing an example of a memory card including a flash memory device according to the inventive concept.

Referring to FIG. 17, a memory card 1200 for supporting mass data storage capability includes a flash memory device 1210 according to the inventive concept that is mounted thereon. The memory card 1200 includes a memory controller 1220 to exchange the overall data between a host and the flash memory device 1210.

An SRAM 1221 is used as a working memory of a processing unit 1222. A host interface 1223 includes a data exchange protocol of a host connected to the memory card 1200. An error correction block 1224 detects and corrects an error included in data read from the flash memory device 1210. A memory interface 225 makes an interface with the flash memory device 1210. The processing unit 1222 performs the overall control operation for exchanging data of the memory controller 1220. Although not shown in the figure, it is apparent to those skilled in the art that the memory card 1200 further includes a ROM (not shown) to store code data for making an interface with the host.

According to the above-described flash memory device, memory card or memory system, a high-reliable memory system may be provided through the flash memory device 1210 with improved erase characteristics of dummy cells. Particularly, a flash memory device according to the inventive concept may be provided in a memory system such as a solid-state disk (SSD) that has been studied in recent years. In this case, a read error arising from dummy cells may be diminished to implement a high-reliable memory system.

Figure 18:
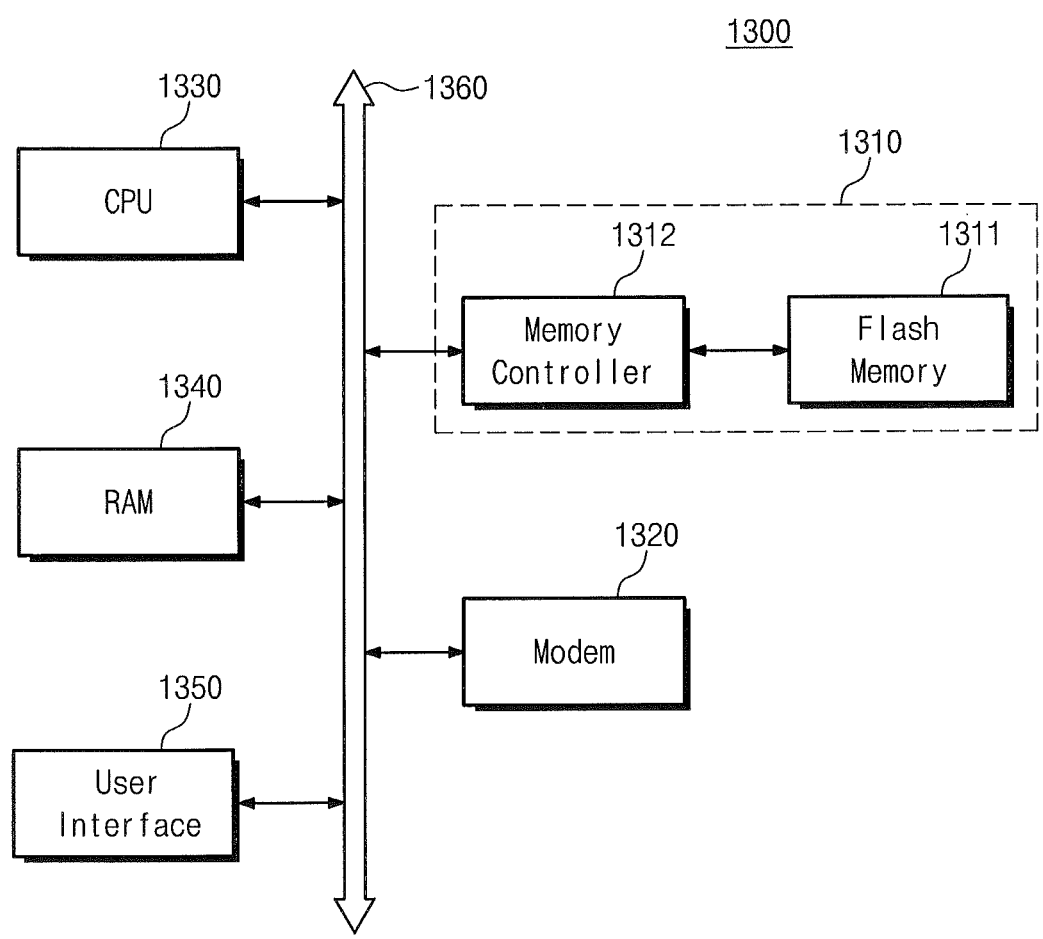
FIG. 18 is a block diagram showing a data processing system on which a flash memory system according to the inventive concept is mounted.

FIG. 18 is a block diagram showing a data processing system on which a flash memory system according to the inventive concept is mounted.

Referring to FIG. 18, a flash memory system 1310 according to the inventive concept is mounted on a data processing system such as a mobile device or a desktop computer. A data processing system 1300 according to the inventive concept includes a modem 1320, a central processing unit (CPU) 1330, a RAM 1340, and a user interface 1350, which are electrically connected to a system bus 1360. The flash memory system 1310 may have substantially the same configuration as the above-described memory system or flash memory system. Data processed by the CPU 1330 or externally input data is stored in the flash memory system 1310. The flash memory system 1310 may include a sold-state disk (SSD). In this case, the data processing system 1300 may more stably store mass data in the flash memory system 1310. With the increase in reliability, the flash memory system 1310 may consume fewer resources in error correction to provide high-speed data exchange functions to the data processing system 1300. Although not shown in the figure, it is apparent to those skilled in the art that the data processing system 1300 may further include an application chipset, a camera image processor (CIS), an input/output device, and the like.

A flash memory device or a memory system according to the inventive concept may be packaged as one of various types to be subsequently embedded. For example, the flash memory device or the memory system may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

As described herein, a first hard mask having a level top surface and thickness sufficient to etch a lower stepped structure is formed on the lower stepped structure. A second hard mask pattern is formed on the first hard mask layer. The second hard mask pattern may be formed by means of an etch process using a photoresist pattern as an etch mask. Since the photoresist pattern is formed on the first hard mask that having a level surface, it may have a more precise size. Thus, the probability of poorer critical dimension (CD) dispersion can be reduced. In addition, a photolithography process for forming the photoresist pattern is performed only once to reduce the process cost and prevent an overlay defect that may occur as photolithography processes are performed two or more times. Furthermore, since an uppermost etch target layer of the lower structure may be etched simultaneously to remove the second hard mask pattern, the number of process steps may decrease.

While the inventive concept has been particularly shown and described with reference to exemplary embodiments thereof, it will be apparent to those of ordinary skill in the art that various changes in form and detail may be made therein without departing from the spirit and scope of the inventive concept, which is defined by the following claims.

What is claimed is:

1. A method for fabricating a semiconductor device, comprising:
preparing a lower structure including a first stack structure including sequentially stacked first etch target layers and a second stack structure disposed on the first stack structure and including second etch target layers each having a width less than those of the first etch target layers;
forming a first hard mask layer to cover the first and second stack structures of the lower structure, the first hard mask layer having a level top surface;
forming a second hard mask pattern on the first hard mask layer, the second hard mask pattern having a width greater than that of the second stack structure but less than that of the first stack structure;
patterning the first hard mask layer using the second hard mask pattern as an etch mask to form a first hard mask pattern and to expose at least a portion of a top surface of the first stack structure;
removing the second hard mask pattern and simultaneously removing an exposed portion of an uppermost first etch target layer of the exposed first stack structure;
reducing a size of the first hard mask pattern, wherein the first hard mask pattern covers the second stack structure after the reducing process; and etching the first stack structure using the first hard mask pattern as an etch mask.

2. The method of claim 1, wherein reducing a size of the first hard mask pattern and etching the first stack structure using the first hard mask pattern as an etch mask are repeated until a lowermost first etch target layer of the first stack structure is etched.

3. The method of claim 1, wherein the first etch target layers include a first sacrificial layer and a first inter-gate dielectric which are sequentially stacked, and
wherein the second hard mask pattern includes materials included in the first sacrificial layer and the first inter-gate dielectric.

4. The method of claim 1, wherein forming the first hard mask layer comprises:
coating a composition for the first hard mask layer on the lower structure; and
curing the composition.

5. The method of claim 4, wherein an ultrasonic wave is applied to the composition at least once during the process of coating the composition for the first hard mask layer on the lower structure and/or curing the composition.

6. The method of claim 4, wherein the composition includes a first polymer and a second polymer, wherein a weight-average molecular weight of the first polymer is at least 1.5 times that of the second polymer.

7. The method of claim 4, wherein the composition includes at least one of the compounds of Formula (1) or Formula (2) below:

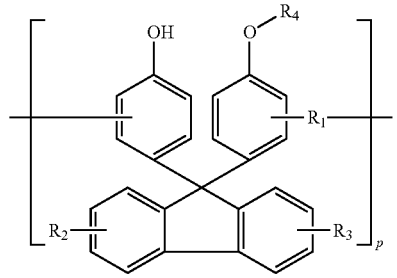

Formula (1)

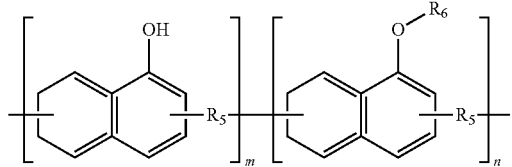

Formula (2)

wherein in Formula (1), p is an integer ranging from 100 to 3000, $R_1$ is a methylene or an arylene; $R_2$ and $R_3$ are each independently a hydroxyl group, halogen or $C_1$-$C_{19}$ alkyl group; and $R_4$ is $C_1$-$C_{19}$ alkyl group or aromatic cyclic compound, and
wherein in Formula (2), n+m is an integer ranging from 100 to 3000; $R_5$ is a methylene or an arylene; and $R_6$ is $C_1$-$C_{19}$ alkyl group or aromatic cyclic compound.

8. The method of claim 7, wherein the composition further includes a surfactant.

9. The method of claim 8, wherein the surfactant is a cationic, anionic or non-ionic surfactant.

10. The method of claim 8, wherein the surfactant is at least one of DBS (dodecylbenzene sulfonic acid) [$C_{12}H_{25}C_6H_4SO_3H$], polyoxyethylene(23) lauryl ether) [$C_{12}H_{25}(OCH_2CH_2)_{23}OH$], polyethylene glycol sorbitan monolaurate, polyoxyethylene isooctylphenyl ether [$CH_3(CH_2)_x(OCH_2CH_2)_yOCH_2COOH$, where x is 11 to 13, and y is 3to 10], and $CF_3(CF_2CF_2)_n(CH_2CH_2O)_yH$, where n is 2 to 4 and y is 3 to 10.

11. The method of claim 8, wherein the surfactant is added in an amount ranging from 0.01 ppm to 1000ppm of the total weight of the composition.

12. The method of claim 1, wherein forming the second hard mask pattern comprises:
forming a second hard mask layer on the first hard mask layer;
forming a photoresist pattern on the second hard mask layer; and
patterning the second hard mask layer using the photoresist pattern as an etch mask.

13. The method of claim 1, wherein forming the first hard mask layer comprises:
forming a first sub-hard mask layer to cover an entire surface of the lower structure, the first sub-hard mask layer having a level top surface; and
forming a second sub-hard mask layer on the first sub-hard mask layer.

14. The method of claim 13, wherein forming the first sub-hard mask layer comprises coating a first composition and curing the first composition; and forming the second sub-hard mask layer comprises coating a second composition and curing the second composition.

15. The method of claim 13, wherein the first composition includes a first compound of Formula (1) below, and wherein the second composition includes a second compound of Formula (2) below:

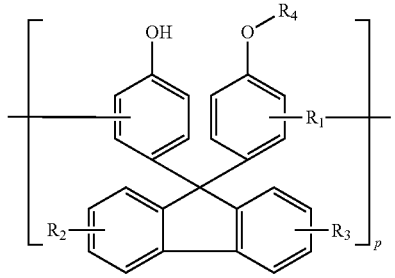

Formula (1)

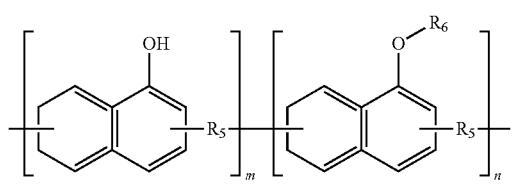

Formula (2)

wherein in Formula (1), p is an integer ranging from 100 to 3000,$R_1$ is a methylene or an arylene; $R_2$ and $R_3$ are each independently a hydroxyl group, halogen or $C_1$ to $C_{19}$ alkyl group; and $R_4$ is $C_1$-$C_{19}$ alkyl group or aromatic cyclic compound, and
wherein in Formula (2), n+m is an integer ranging from 100 to 3000; $R_5$ is a methylene or an arylene; and $R_6$ is $C_1$-$C_{19}$ alkyl group or aromatic cyclic compound.

16. The method of claim 1, wherein ends of the second etch target layers are formed to have a step formation.

* * * * *